United States Patent
Gao et al.

(10) Patent No.: US 10,234,500 B2
(45) Date of Patent: Mar. 19, 2019

(54) SYSTEMATIC DEFECTS INSPECTION METHOD WITH COMBINED EBEAM INSPECTION AND NET TRACING CLASSIFICATION

(71) Applicant: GLOBALFOUNDRIES Inc., Grand Cayman (KY)

(72) Inventors: Weihong Gao, Saratoga Springs, NY (US); Xuefeng Zeng, Niskayuna, NY (US); Yan Pan, Clifton Park, NY (US); Peter Lin, Ballston Lake, NY (US); Hoang Nguyen, Saratoga Springs, NY (US); Ho Young Song, Clifton Park, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 378 days.

(21) Appl. No.: 14/689,088

(22) Filed: Apr. 17, 2015

(65) Prior Publication Data
US 2016/0306009 A1 Oct. 20, 2016

(51) Int. Cl.
*G01R 31/04* (2006.01)
*G01R 31/305* (2006.01)

(52) U.S. Cl.
CPC .................. *G01R 31/305* (2013.01)

(58) Field of Classification Search
CPC .................................................. G01R 31/305
USPC ................... 324/762.01, 501, 515, 527, 528, 324/754.22–23, 754.27
See application file for complete search history.

(56) References Cited

U.S. PATENT DOCUMENTS

| | | | |
|---|---|---|---|
| 2008/0267489 A1* | 10/2008 | Xiao | G06T 7/001 382/147 |
| 2010/0320381 A1* | 12/2010 | Zhao | G01N 23/225 250/307 |
| 2011/0013826 A1* | 1/2011 | Xiao | G01R 31/307 382/149 |
| 2011/0314336 A1* | 12/2011 | Wu | G01R 31/2894 714/37 |
| 2015/0154746 A1* | 6/2015 | Zafar | G03F 1/84 382/149 |

OTHER PUBLICATIONS

Patterson et al., "E-Beam Inspection System for Comparison of Wafer and Design Data", Metrology, Inspection, and Process Control for Microlithography XXVI, Proc of SPIE, 2012, vol. 8324, 9 pages.

* cited by examiner

*Primary Examiner* — Melissa J Koval
*Assistant Examiner* — Courtney G McDonnough
(74) *Attorney, Agent, or Firm* — Ditthavong & Steiner, P.C.

(57) ABSTRACT

A method and apparatus for separating real DVC via defects from nuisance based on Net Tracing Classification of eBeam VC die comparison inspection results are provided. Embodiments include performing an eBeam VC die comparison inspection on each via of a plurality of dies; determining DVC vias based on the comparison; performing a Net Tracing Classification on the DVC vias; determining S/D DVC vias based on the Net Tracing Classification; and performing a die repeater analysis on the S/D DVC vias to determine systematic design-related DVC via defects.

16 Claims, 3 Drawing Sheets

| Fail on >2 dies | Defect Count | Die Count | Failure locations |
|---|---|---|---|
| Total | 16 _301_ | 5 | 6 |
| Fail on 2 dies | 4 _303_ | 2 _307_ | 2 _305_ |
| Fail on 3 dies | 12 _309_ | 3 _313_ | 4 _311_ |

FIG. 3

SYSTEMATIC DEFECTS INSPECTION METHOD WITH COMBINED EBEAM INSPECTION AND NET TRACING CLASSIFICATION

TECHNICAL FIELD

The present disclosure relates to a manufacture of semiconductor devices such as integrated circuits. The present disclosure is particularly applicable to detecting systematic un-landed via defects at the 20 nanometer (nm) technology node and beyond.

BACKGROUND

Design systematic defects pose critical yield bottleneck in the semiconductor design process, especially at the beginning phase of yield ramping for a product. One of the most effective ways to detect systematic via failure is by electron beam (eBeam) voltage contrast (VC) die-to-database (D2DB) inspection, which compares the voltage contrast of vias in silicon to the design. It can effectively detect an open via, a missing pattern, and critical dimension (CD) shrinkage. However, both real defective vias and electrically floating vias show up as dark voltage contrast (DVC) and cannot be separated from real DVC defects.

A need therefore exists for methodology and apparatus enabling separation of real DVC via defects from nuisance after eBeam VC die comparison inspection.

SUMMARY

An aspect of the present disclosure is a method of using Net Tracing Classification to separate real DVC via defects from nuisance after eBeam VC die comparison inspection based on the electrical connectivity of each via.

Another aspect of the present disclosure is an apparatus that separates real DVC via defects from nuisance after eBeam VC die comparison inspection based on Net Tracing Classification.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: performing an eBeam VC die comparison inspection on each via of a plurality of dies; determining DVC vias based on the comparison; performing a Net Tracing Classification on the DVC vias; determining source/drain (S/D) DVC vias based on the Net Tracing Classification; and performing a die repeater analysis on the S/D DVC vias to determine systematic design-related DVC via defects.

Aspects of the present disclosure include performing the eBeam VC die comparison by: a D2DB comparison. Other aspects include the plurality of ideas being three dies. Further aspects include performing the Net Tracing Classification based on an electrical connectivity of each DVC via to a S/D region, a gate, or a metal layer, respectively. Additional aspects include separating the DVC vias into S/D, gate, and floating via groups, respectively, based on the Net Tracing Classification. Another aspect includes performing the die repeater analysis by: determining patterns of the S/D DVC vias in a same location on at least two dies of the plurality. Other aspects include the Net Tracing Classification filtering nuisance DVC vias post die comparison inspection. Further aspects include the DVC via defects being un-landed S/D vias.

Another aspect of the present disclosure is an apparatus including: a processor; and a memory including computer program code for one or more programs, the memory and the computer program code configured to, with the processor, cause the apparatus to: perform an eBeam VC die comparison inspection on each via of a plurality of dies; determine DVC vias based on the comparison; perform a Net Tracing Classification on the DVC vias based on an electrical connectivity of each DVC via; determine S/D DVC vias based on the Net Tracing Classification; and perform a die repeater analysis on the S/D DVC vias to determine systematic design-related DVC via defects.

Aspects of the apparatus include the apparatus being caused, with respect to performing the eBeam VC die comparison, to: perform a D2DB comparison. Other aspects include the plurality of dies being three dies. Further aspects include the apparatus being caused, with respect to the Net Tracing Classification, to: perform the classification based on an electrical connectivity of each DVC via to a S/D region, a gate, or a metal layer, respectively. Additional aspects include the apparatus being further caused to: separate the DVC vias into S/D, gate, and floating via groups, respectively, based on the Net Tracing Classification. Another aspect includes the apparatus being caused, with respect to performing the die repeater analysis, to: determine patterns of the S/D DVC vias in a same location on at least two dies of the plurality. Other aspects include the Net Tracing Classification filtering nuisance DVC vias post die comparison inspection. Further aspects include the apparatus being further caused to: determine the DVC via defects based on the DVC vias being un-landed vias.

A further aspect of the present disclosure is a method including: performing an eBeam VC D2DB inspection on each via of three dies; determining DVC vias based on the D2DB inspection; performing a Net Tracing Classification on the DVC vias; determining active region DVC vias based on the Net Tracing Classification; and performing a die repeater analysis on the active region vias to determine systematic design-related DVC via defects.

Aspects of the present disclosure include performing the Net Tracing Classification based on an electrical connectivity of each DVC via to an active region, a gate, or a metal layer, respectively. Other aspects include separating the DVC vias into active region, gate, and floating via groups, respectively, based on the Net Tracing Classification. Further aspects include performing the die repeater analysis by: determining patterns of the active region DVC vias in a same location on at least two dies of the three dies.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIG. 3 illustrates an example determination of real DVC via defects based on a Net Tracing Classification of eBeam VC die comparison inspection results, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of both real defective vias and electrically floating vias showing up as DVC after eBeam VC die comparison inspection attendant upon detecting systematic via failure among semiconductor devices.

Methodology in accordance with embodiments of the present disclosure includes performing an eBeam VC die comparison inspection on each via of a plurality of dies. DVC vias are determined based on the comparison. A Net Tracing Classification is performed on the DVC vias. S/D DVC vias are determined based on the Net Tracing Classification and a die repeater analysis is performed on the S/D DVC vias to determine systematic design-related DVC via defects.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1A:
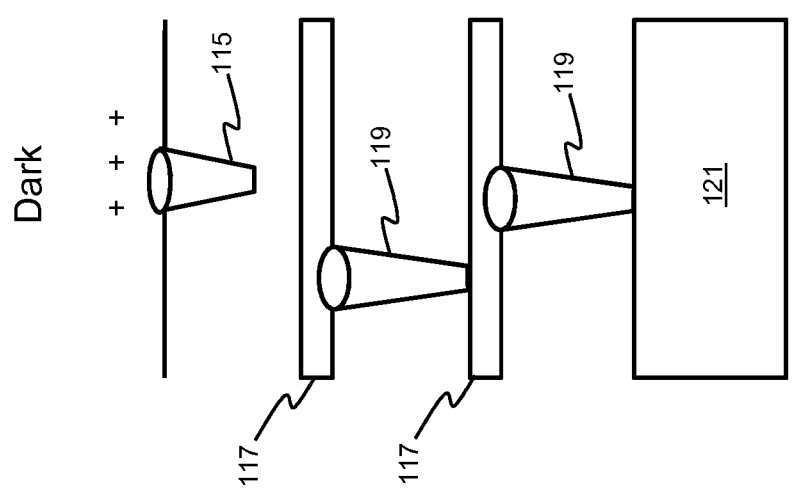
FIGS. 1A and 1B schematically illustrate a background example D2DB eBeam VC inspection diagram with bright and dark results, respectively.
Figure 1B:
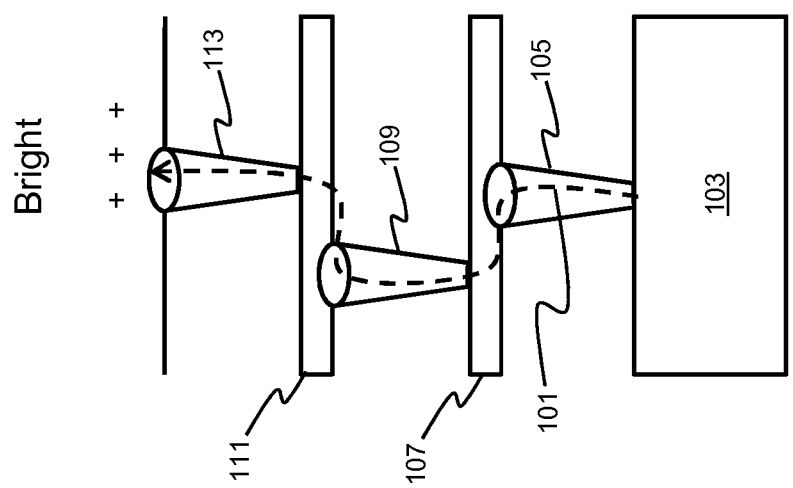

Adverting to FIG. 1A, during D2DB eBeam VC inspection on un-landed via DVC, an electron represented by the dashed line 101 travels from a substrate 103 through a first via 105, a first metal layer 107, a second via 109, a second metal layer 111 and through a final via 113, producing a bright result. In contrast, because the via 115 of FIG. 1B is floating or separated from the metal layers 117, the vias 119, and the substrate 121, the result is DVC. However, as previously stated, DVC vias determined from eBeam D2DB inspection can either be electrically floating or defective and, therefore, not necessarily real DVC defects.

Figure 2:
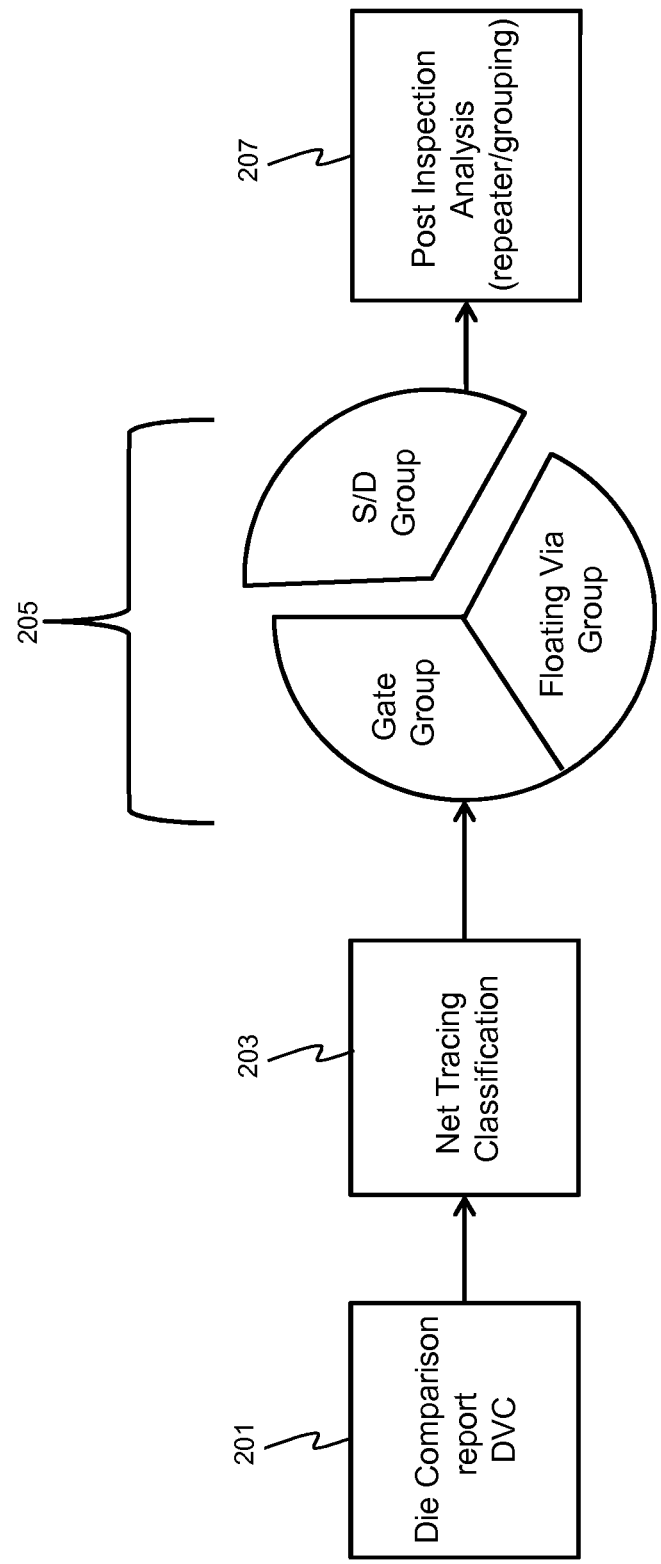
FIG. 2 illustrates a Net Tracing Classification of eBeam VC die comparison inspection results flow, in accordance with an exemplary embodiment.

Adverting to FIG. 2, in step 201, an eBeam VC die comparison inspection, e.g., D2DB, is performed on each via of a plurality of dies, e.g., three (3) dies. Presently, the eBeam inspection is limited to an examination of three dies at one time because of the amount of time required to scan each die. The die comparison inspection may be a D2DB comparison to capture the systematic defects that may not be able to be captured by a die-to-die (D2D) comparison. However, a D2D comparison may alternatively be used. Once the DVC vias are determined based on the die comparison, a Net Tracing Classification is performed on the resultant DVC vias, as depicted in step 203. The Net Tracing Classification software separates the DVC vias into S/D, gate, and floating via groups, as depicted in step 205. The Net Tracing Classification groups are based on an electrical connectivity of each DVC via to a S/D region, a gate, or a metal layer, respectively. The S/D group represents vias that are supposed to be connected to an active region. If any S/D vias fail due to an un-landed issue, it will be detected as a DVC defect. In contrast, vias connected to the gate show dark contrast by design. Floating vias are connected only to a metal layer. If inspected post via etch, all floating vias will show dark contrast by design. Consequently, Net Tracing Classification filters out nuisance DVC vias post eBeam VC die comparison inspection.

Once the S/D DVC vias are classified and separated in step 205, a die repeater analysis is performed on the S/D DVC vias to determine DVC via defects, as depicted in step 207. The die repeater analysis determines whether patterns of the S/D DVC vias are found in the same location across multiple dies being examined, e.g., on at least two of the three dies being examined. Patterns of DVC vias that are determined in the same location on at least two dies indicate un-landed S/D vias and, therefore, real DVC defects.

In one example Net Tracing Classification of eBeam VC die comparison inspection results, an eBeam D2DB inspection of a first die determined the presence of approximately 900 DVC vias. However, as discussed above, not all of these DVC vias are real DVC defects. Therefore, the 900 DVC vias are submitted to Net Tracing Classification and die repeater analysis as described with respect to the steps of FIG. 2. Of the 900 DVC vias, 16 S/D DVC vias are determined to be in the same location on at least two of the three dies being examined, as depicted in box 301 of FIG. 3. In particular, 4 S/D DVC vias were determined in the same 2 locations on 2 dies, as depicted in boxes 303, 305, and 307, respectively. Further, 12 S/D DVC vias were determined in the same 4 locations on 3 dies, as depicted in boxes 309, 311, and 313, respectively. Accordingly, 16 S/D DVC vias out of the 900 DVC vias are determined to be real DVC defects.

The embodiments of the present disclosure can achieve several technical effects including differentiating real DVC defects from nuisance and improving eBeam inspection data accuracy. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices in the 20 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
performing an electron beam (eBeam) voltage contrast (VC) die comparison inspection on each via of a plurality of dies;
determining dark voltage contrast (DVC) vias based on the comparison;
performing net tracing on the DVC vias and classifying nuisance DVC vias;
filtering nuisance DVC vias post eBeam VC die-to-database (D2DB) inspection;
determining source/drain (S/D) DVC vias; and
performing a die repeater analysis on the S/D DVC vias to determine DVC via defects and improving eBeam inspection data accuracy for the plurality of dies by separating the DVC via defects from the nuisance DVC vias.

2. The method according to claim 1, wherein the plurality of dies comprises three dies.

3. The method according to claim 1, comprising performing the Net Tracing Classification based on an electrical connectivity of each DVC via to a S/D region, a gate, or a metal layer, respectively.

4. The method according to claim 1, further comprising separating the DVC vias into S/D, gate, and floating via groups, respectively.

5. The method according to claim 1, comprising performing the die repeater analysis by:
determining patterns of the S/D DVC vias in a same location on at least two dies of the plurality.

6. The method according to claim 1, wherein the DVC via defects comprise un-landed S/D vias.

7. An apparatus comprising:
a processor; and
a memory including computer program code for one or more programs, the memory and the computer program code configured to, with the processor, cause the apparatus to:
perform an electron beam (eBeam) voltage contrast (VC) die comparison inspection on each via of a plurality of dies;
determine dark voltage contrast (DVC) vias based on the comparison;
perform net tracing on the DVC vias based on an electrical connectivity of each DVC via, and filtering nuisance DVC vias post eBeam VC die-to-database (D2DB) inspection;
determine source/drain (S/D) DVC vias; and
perform a die repeater analysis on the S/D DVC vias to determine systematic design-related DVC via defects and improving eBeam inspection data accuracy for the plurality of dies by separating the DVC via defects from the nuisance DVC vias.

8. The apparatus according to claim 7, wherein the plurality of dies comprises three dies.

9. The apparatus according to claim 7, wherein the apparatus is caused to:
perform the classification based on an electrical connectivity of each DVC via to a S/D region, a gate, or a metal layer, respectively.

10. The apparatus according to claim 7, wherein the apparatus is further caused to:
separate the DVC vias into S/D, gate, and floating via groups, respectively.

11. The apparatus according to claim 7, wherein the apparatus is caused, with respect to performing the die repeater analysis, to:
determine patterns of the S/D DVC vias in a same location on at least two dies of the plurality.

12. The apparatus according to claim 7, wherein the apparatus is further caused to:
determine the DVC via defects based on the DVC vias being un-landed vias.

13. A method comprising:
performing an electron beam (eBeam) voltage contrast (VC) die-to-database (D2DB) inspection on each via of three dies;
determining dark voltage contrast (DVC) vias based on the D2DB inspection;
performing net tracing on the DVC vias and filtering nuisance DVC vias post eBeam VC D2DB inspection;
determining active region DVC vias; and
performing a die repeater analysis on the active region vias to determine systematic design-related DVC via defects and improving eBeam inspection data accuracy for the plurality of dies by separating the systematic design-related DVC via defects from the nuisance DVC vias.

14. The method according to claim 13, comprising performing the net tracing based on an electrical connectivity of each DVC via to an active region, a gate, or a metal layer, respectively.

15. The method according to claim 13, further comprising separating the DVC vias into active region, gate, and floating via groups, respectively, based on the Net Tracing Classification.

16. The method according to claim 13, comprising performing the die repeater analysis by:
determining patterns of the active region DVC vias in a same location on at least two dies of the three dies.

* * * * *